US012107383B2

(12) United States Patent
Cheng et al.

(10) Patent No.: US 12,107,383 B2
(45) Date of Patent: Oct. 1, 2024

(54) SEMICONDUCTOR LASER AND FABRICATION METHOD THEREFOR

(71) Applicant: SHENZHEN LIGHTING INSTITUTE, Shenzhen (CN)

(72) Inventors: Chao-Chen Cheng, Shenzhen (CN); Anh Chuong Tran, Shenzhen (CN)

(73) Assignee: SHENZHEN LIGHTING INSTITUTE, Shenzhen (CN)

( * ) Notice: Subject to any disclaimer, the term of this patent is extended or adjusted under 35 U.S.C. 154(b) by 712 days.

(21) Appl. No.: 17/296,140

(22) PCT Filed: Oct. 16, 2019

(86) PCT No.: PCT/CN2019/111423
§ 371 (c)(1),
(2) Date: Oct. 26, 2021

(87) PCT Pub. No.: WO2020/103612
PCT Pub. Date: May 28, 2020

(65) Prior Publication Data
US 2022/0247147 A1 Aug. 4, 2022

(30) Foreign Application Priority Data
Nov. 21, 2018 (CN) .......................... 201811393151.2

(51) Int. Cl.
H01S 5/024 (2006.01)
H01S 5/02 (2006.01)
(Continued)

(52) U.S. Cl.
CPC ........ H01S 5/0202 (2013.01); H01S 5/02469 (2013.01); H01S 5/028 (2013.01); H01S 5/4025 (2013.01)

(58) Field of Classification Search
CPC .... H01S 5/0202; H01S 5/02469; H01S 5/028; H01S 5/4025
See application file for complete search history.

(56) References Cited

U.S. PATENT DOCUMENTS 5,284,792 A * 2/1994 Forster ................. H01S 5/0201
438/33
6,887,770 B2 * 5/2005 Ueda ................. H01L 21/76251
438/455

(Continued)

FOREIGN PATENT DOCUMENTS

CN 101894796 A 11/2010
CN 103633549 A 3/2014
(Continued)

OTHER PUBLICATIONS

English translation of JPH0738199 which was listed on the IDS filed May 21, 2021, and already provided by the applicant.*

Primary Examiner — Eugene Lee
(74) Attorney, Agent, or Firm — ScienBiziP, P.C.

(57) ABSTRACT

A semiconductor laser and a fabrication method therefor. The method comprises: providing a heat sink motherboard, and cutting the heat sink motherboard to form a plurality of heat sink substrates (300) (S11); providing an epitaxial wafer (200) (S12); bonding the plurality of heat sink substrates (300) to the epitaxial wafer (200) in an array to form a plurality of gaps parallel to the direction of resonant cavities (210) and perpendicular to the direction of the resonant cavities (210) (S13); dividing the epitaxial wafer (200) along the gaps to obtain a plurality of laser chips (S14); and stacking the plurality of laser chips, and coating the plurality of stacked laser chips to form a plurality of semiconductor lasers (S15).

8 Claims, 6 Drawing Sheets

(51) Int. Cl.
 H01S 5/028 (2006.01)
 H01S 5/40 (2006.01)

(56) References Cited

U.S. PATENT DOCUMENTS

| | | | | |
|---|---|---|---|---|
| 7,825,006 | B2* | 11/2010 | Nakamura | H01L 33/0093 |
| | | | | 438/26 |
| 8,361,881 | B2* | 1/2013 | Zakel | H01L 23/10 |
| | | | | 438/455 |
| 2011/0042646 | A1* | 2/2011 | Ohta | H01S 5/320275 |
| | | | | 257/E29.069 |
| 2011/0292959 | A1* | 12/2011 | Shimamoto | H01S 5/2201 |
| | | | | 438/33 |
| 2013/0032825 | A1* | 2/2013 | Wasserbauer | H01L 33/20 |
| | | | | 257/98 |
| 2023/0005793 | A1* | 1/2023 | Kamikawa | H01L 21/02576 |

FOREIGN PATENT DOCUMENTS

| | | |
|---|---|---|
| CN | 106300010 A | 1/2017 |
| JP | H0738199 A | 2/1995 |
| JP | 2014183120 A | 9/2014 |

\* cited by examiner

SEMICONDUCTOR LASER AND FABRICATION METHOD THEREFOR

TECHNICAL FIELD

The present disclosure relates to the field of lasers, and in particular to a semiconductor laser and a fabrication method therefor.

BACKGROUND

All-solid-state laser by a semiconductor laser-pumped is a new type of laser that appeared in the late 1980s. Its overall efficiency is at least 10 times higher than lamp pumping. Due to the reduced heat load per unit output, higher power can be obtained. The system life and reliability are about 100 times that of flashlamp pumping systems. Therefore, semiconductor laser pumping technology has injected new vitality and vigor into solid-state lasers, so that solid-state lasers have the dual characteristics of solid-state lasers and semiconductor lasers. Its appearance and gradual maturity are a revolution in solid-state lasers, and also a development direction of solid-state lasers. Moreover, it has penetrated various disciplines, such as laser information storage and processing, laser material processing, laser medicine and biology, laser communication, laser printing, laser spectroscopy, laser chemistry, laser separation isotope, laser nuclear fusion, laser projection display, laser detection and measurement, and military laser technology have greatly promoted technological progress and unprecedented development in these fields.

Semiconductor linear array lasers for side pumping sources on the market often consist of four or more independent lasers. At present, the packaging process of this kind of laser is first to split and spray the entire laser chip. Specifically, the laser chip is split into a laser bar structure, and then the laser bar structure needs to be coated with a high-reflection film along the back cavity surface of the cavity and an antireflection film on the front cavity surface. The existing preparation process solves the shadow effect of the coating process by stacking the laser bars and the supporting member and setting the area of the supporting member indented relative to the laser bars. As shown in FIG. 1, each piece of laser bar 400 is superimposed on one supporting element 100, and then the front cavity surfaces and the back cavity surfaces of the laser bars 400 are respectively coated with an antireflection film and a high reflection film. Then the laser bars 400 from the support 100 need to be separated to perform the next step of bonding the laser bars 400 to a heat sink substrate. Therefore, the existing laser bar coating process requires a set of independent processes to complete, which increases production processes, resulting in the failure to greatly improve the production efficiency of the laser. Therefore, a new type of preparation method for a semiconductor laser is urgently needed.

SUMMARY

The present disclosure provides a semiconductor laser and a preparation method thereof, which can solve the problem that the coating process in the preparation of the semiconductor laser in the prior art is relatively complicated and the cost is relatively high.

A technical solution adopted in the present disclosure is to provide a fabrication method for a semiconductor laser. The method includes S11: providing a heat sink motherboard, and cutting the heat sink motherboard to form a plurality of heat sink substrates; S12: providing an epitaxial wafer, the epitaxial wafer including a plurality of resonant cavities arranged in parallel; S13: bonding the plurality of heat sink substrates to the epitaxial wafer in an array to form a plurality of gaps parallel to a direction of the resonant cavities and a plurality of gaps perpendicular to the direction of the resonant cavities; S14: dividing the epitaxial wafer along the gaps to obtain a plurality of laser chips; S15: stacking the plurality of laser chips and coating the plurality of laser chips in a stacked state to form a plurality of semiconductor lasers, so that each of the semiconductor lasers includes at least one laser bar.

According to an embodiment of the present disclosure, the step S14 includes performing a first splitting on the epitaxial wafer with a first depth and a first width along the gaps perpendicular to the resonant cavities to form cleavage planes of the plurality of laser chips.

According to an embodiment of the present disclosure, the step S15 includes sequentially stacking the plurality of the laser chips, so that front cavity surfaces of the plurality of laser chips perpendicular to the resonant cavities and back cavity surfaces of the plurality of laser chips perpendicular to the resonant cavities are respectively on the same plane.

According to an embodiment of the present disclosure, the step S14 further includes performing a second splitting on the epitaxial wafer with a second depth and a second width along the gaps parallel to the resonant cavities.

According to an embodiment of the present disclosure, the step S15 includes coating the cleavage planes of the plurality of laser chips in a stacked state to form resonant cavities, wherein an antireflection film is coated on front cavity surfaces of the resonant cavities, and a reflective film is coated on back cavity surfaces of the resonant cavities.

According to an embodiment of the present disclosure, the step S12 or S13 includes thinning and polishing a side of the epitaxial wafer away from the heat sink substrates.

According to an embodiment of the present disclosure, the heat sink substrates are one of metal substrates, ceramic substrates, or sapphire substrates.

In order to solve the above technical problems, the present disclosure also provides a semiconductor laser, which includes a heat sink substrate; and at least one laser bar, and the laser bar includes a resonant cavity.

The beneficial effects of the present disclosure are: different from the prior art, the present disclosure provides a semiconductor laser and a preparation method thereof, by splitting an epitaxial wafer after bonding a heat sink substrate array thereon to form a plurality of laser chips, then stacking the plurality of laser chips and coating the plurality of laser chips in a stacked state, the support bars in the prior art are replaced directly with the heat sink substrates, thereby saving materials, and reducing the process of welding with the heat sink substrate after coating the support bars and separating again; fabrication is completed directly in one step, thereby simplifying the process and reducing costs.

BRIEF DESCRIPTION OF DRAWINGS

In order to illustrate the technical solutions more clearly in the embodiments of the disclosure, the following will briefly introduce the drawings needed in the description of the embodiments. Obviously, the drawings in the following description are only some embodiments of the disclosure. For those of ordinary skill in the art, without creative work, other drawings can be obtained based on these drawings, among which.

DESCRIPTION OF EMBODIMENTS

Figure 1:
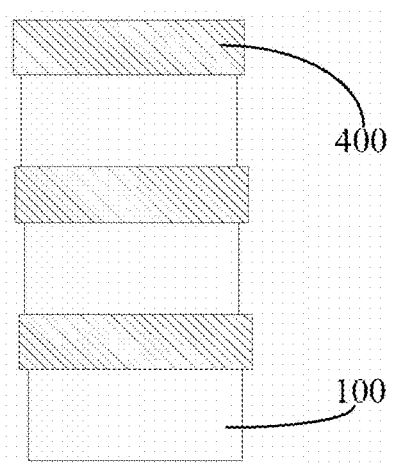
FIG. 1 is a schematic front view of a laser coating in the prior art.

The technical solutions in the embodiments of the present disclosure will be described clearly and completely with reference to the drawings in the embodiments of the present disclosure. Obviously, the described embodiments are only a part of the embodiments of the present disclosure, rather than all the embodiments. Based on the embodiments in the present disclosure, all other embodiments obtained by a person of ordinary skill in the art without creative work fall within the protection scope of the present disclosure.

It should be noted that if there is a directional indication (such as up, down, left, right, front, back . . . ) in the embodiments of the present disclosure, the directional indication is only used to explain the relative positional relationship, movement, etc. between the components in a specific posture (as shown in the drawings). If the specific posture changes, the directional indication will also change accordingly.

In addition, if there are descriptions related to "first", "second", etc. in the embodiments of the present disclosure, the descriptions of "first", "second", etc. are for descriptive purposes only, and cannot be understood as instructions or imply its relative importance or implicitly indicate the number of technical features indicated. Therefore, the features defined with "first", "second" may explicitly or implicitly include at least one of the features. In addition, the technical solutions between the various embodiments can be combined with each other, but it must be based on what can be achieved by a person of ordinary skill in the art. When the combination of technical solutions is contradictory or cannot be achieved, it should be considered that such a combination of technical solutions does not exist, nor is it within the scope of protection required by the present disclosure.

Please refer to FIGS. 2 through 7. The present disclosure provides a fabrication method for a semiconductor laser, including a schematic flow diagram and a schematic structural diagram thereof.

Figure 2:
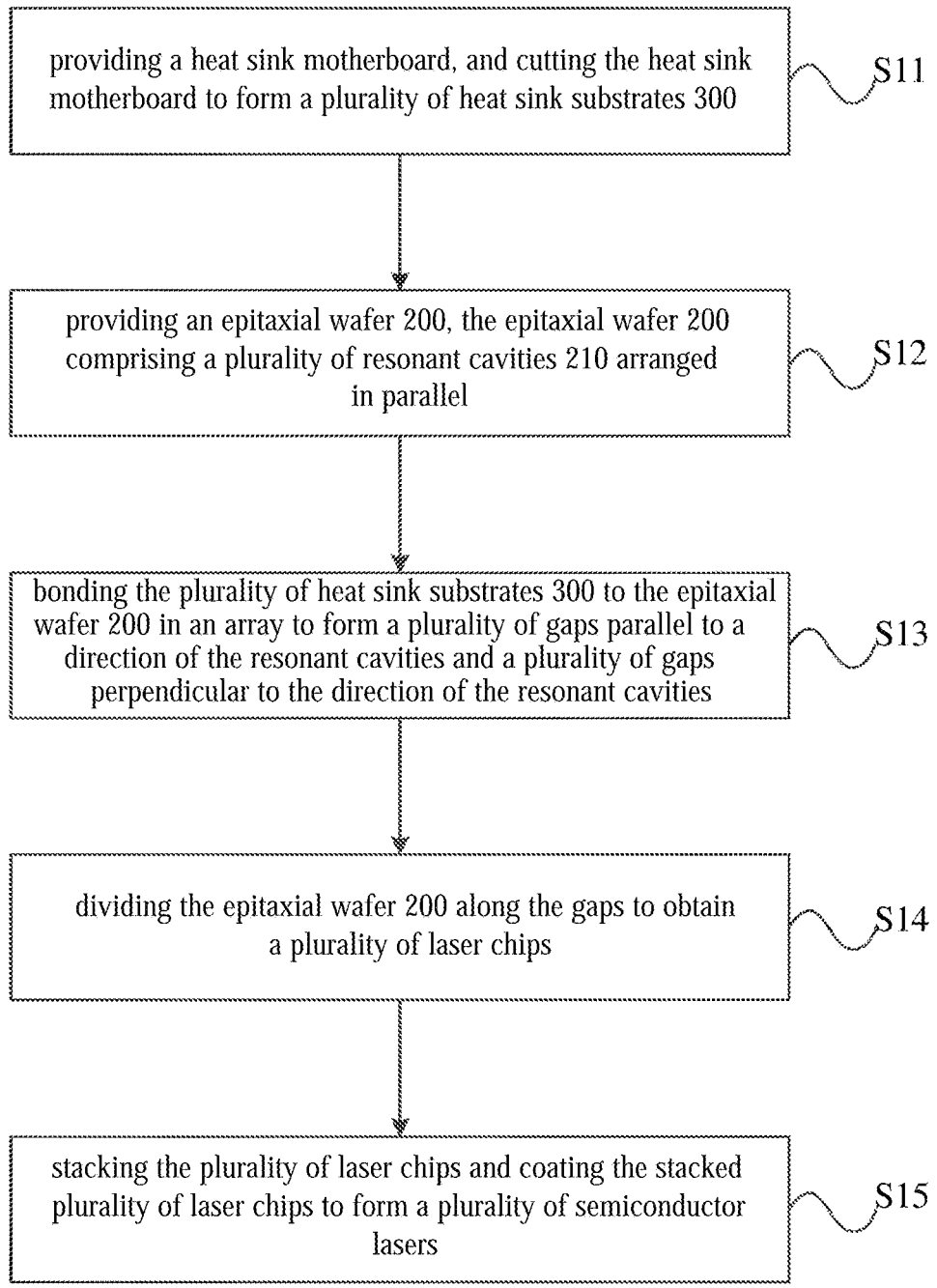
FIG. 2 is a schematic flowchart of a first embodiment of a fabrication method for a semiconductor laser according to the present disclosure.

Please refer to FIG. 2. FIG. 2 is a schematic flowchart of a first embodiment of the fabrication method for a semiconductor laser according to the present disclosure. The method specifically includes the following steps.

In S11, a motherboard of heat sink substrates is provided, and the motherboard of heat sink substrates is cut to form a plurality of heat sink substrates 300.

The motherboard of heat sink substrates provided in the present disclosure may be a metal substrate, which itself has good thermal conductivity and electrical conductivity. Or the motherboard of heat sink substrates provided in the present disclosure may be a double-layer thermally conductive substrate, one of which is a metal substrate, and the other is a heat dissipation substrate, or a ceramic substrate with good heat dissipation performance.

In a specific embodiment, the specific length and width of the heat sink substrate 300 are selected according to the material of the epitaxial wafer and the subsequent process yield, which will not be repeated here.

The motherboard is cut to form a plurality of heat sink substrates 300. The cutting process can be photolithography, laser, split saw, water jet, and so on. Preferably, the plurality of heat sink substrates 300 has a same size.

Among them, the linear thermal expansion coefficient of the heat sink substrate needs to be well matched with the linear thermal expansion coefficient of the epitaxial wafer material. If the heat generated during the operation of the semiconductor laser cannot be taken away in time, the temperature of the entire semiconductor laser will rise. Different expansion coefficients lead to different heating deformations, stress between the epitaxial wafer material and the heat sink substrate material, and the smile effect is prone to occur, which damages the semiconductor laser chip and degrades the photoelectric characteristics of the semiconductor laser. If the stress is too large, it may even break the laser chip, causing the semiconductor laser to suddenly fail. Therefore, metal copper, graphene or ceramics are usually used as the heat sink substrate with a high thermal conductivity material approximately equivalent to the thermal expansion coefficient of the epitaxial wafer.

In S12, an epitaxial wafer 200 is provided, and the epitaxial wafer 200 includes a plurality of resonant cavities 210 arranged in parallel.

The epitaxial wafer includes a substrate, and the substrate is used for epitaxial growth of various layers of laser materials thereon; the epitaxial wafer includes a buffer layer, the buffer layer is arranged on the substrate, and its purpose is to form a high-quality epitaxial surface, reduce the stress between the substrate and other material layers, and eliminate the propagation of substrate defects to other layers to facilitate the growth of other material layers; the epitaxial wafer includes a lower confinement layer, the lower confinement layer is arranged on the buffer layer, and its purpose is to limit the expansion of the optical field transverse mode to the buffer layer and the substrate, reduce the loss of light, and at the same time limit the diffusion of carriers, reduce hole leakage current and reduce the threshold current of the device and improve light efficiency; the epitaxial wafer includes a lower waveguide layer, the lower waveguide layer is arranged on the lower confinement layer, and its purpose is to strengthen the restriction of the optical field, reduce the far-field divergence angle of the beam, and improve the beam quality of the semiconductor laser chip device, and the low waveguide layer uses a small amount of doped material to reduce the light absorption loss; and the epitaxial wafer includes an active layer, the epitaxial wafer is arranged on the lower waveguide layer, and its function is to act as an active region of the laser, provide sufficient optical gain, and determine the lasing wavelength of the semiconductor laser chip device and the service life of the semiconductor laser chip device; the epitaxial wafer includes an upper waveguide layer, the upper waveguide layer is arranged on the active layer, its purpose is to strengthen the limitation of the optical field, reduce the far-field divergence angle of the beam, improve the beam quality of the semiconductor laser chip device, and the upper waveguide layer uses a small amount of doped material to reduce the light absorption loss; the epitaxial wafer includes a P-type upper confinement layer, the upper confinement layer is arranged on the upper waveguide layer, its purpose is to limit the expansion of the optical field transverse mode to the buffer layer and the substrate, reduce the loss of light, and at the same time limit the diffusion of carriers, reduce the hole leakage current to reduce the threshold current of the semiconductor laser chip device and improve light efficiency; the epitaxial wafer includes a transition layer, the transition layer is arranged on the upper confinement layer, its purpose is to reduce the stress between the upper confinement layer and the electrode contact layer, and realize the transition from the upper confinement layer to the electrode contact layer. It can be understood that in a modified embodiment, when the adhesion between the confinement layer and the electrode layer material is good, no transition layer is required.

In a specific embodiment, the epitaxial wafer 200 further includes a resonant cavity 210. The resonant cavity 210 is formed by etching above the confinement layer, and a depth of the etching does not exceed the confinement layer, that is, a part of the waveguide layer and the confinement layer on both sides are etched away, leaving the unetched waveguide layer and confinement layer in the middle, to form the resonant cavity 210. The advantage of setting the resonant cavity 210 is to form a certain gradient refractive distribution on a side of the epitaxial wafer, which has a certain restrictive effect on the lateral light. In addition, in some high-power lasers, the resonant cavity also serves as a filter for mode selection. The etching method, the etching depth, and the width of the resonant cavity 210 are conventional technologies in the art, and will not be repeated here.

A material of each layer of the epitaxial wafer 200 may specifically be one or more of GaAs, AlGaAs, InAs, InGaAs, GaInP, GaInAsP, AlGaInP, GaN, GaInN, AlGaN, and AlGaInN.

In S13, the plurality of heat sink substrates 300 is bonded to the epitaxial wafer in an array.

Figure 4:
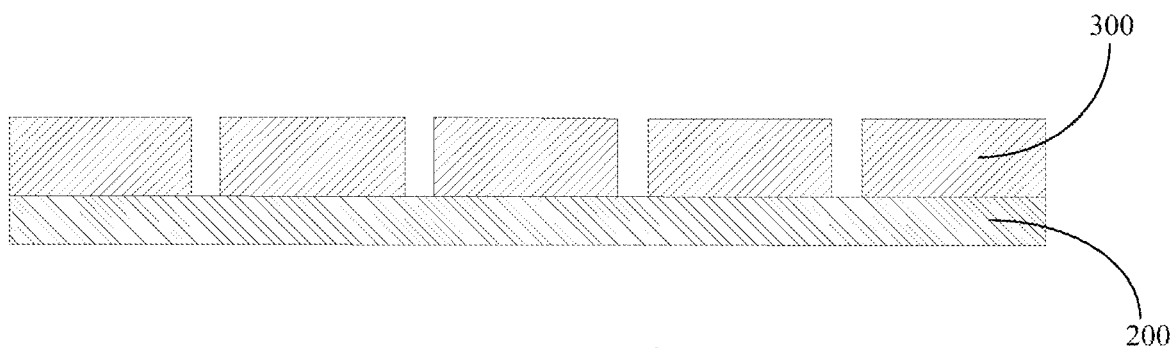
FIG. 4 is a schematic side view or front view of the present disclosure after the heat sink substrates are fixed to the epitaxial wafer.

As shown in FIG. 4, FIG. 4 is a side view or front view of the array of the plurality of heat sink substrates 300 attached to the epitaxial wafer 200. The bonding method can be welding or gluing, so that make the plurality of heat sink substrates 300 can be arranged in an array on the P surface of the epitaxial wafer 200, and form a plurality of gaps parallel to the direction of the resonant cavity and perpendicular to the direction of the resonant cavity, and in the direction perpendicular to the resonant cavities 210, the edge lines on the same side of a column of heat sink substrates 300 are on the same straight line, and in a direction parallel to the resonant cavities 210, the edge lines on the same side of a row of heat sink substrates are also on the same straight line.

In addition, the width and length of the array of the plurality of heat sink substrates 300 are slightly less than the width and length of the epitaxial wafer 200, respectively. The purpose of this design is to define the gaps through the edge lines of the plurality of heat sink substrates distributed in an array, so as to provide a reference line for the subsequent epitaxial wafer splitting process. Therefore, the edge lines of the heat sink substrates 300 are required to be on the same line as much as possible in a certain direction to ensure the cleavage yield in the later stage.

Further, a side of the epitaxial wafer 200 that faces away from the heat sink substrate 300 can be thinned and polished, so that the N surface of the epitaxial wafer 200 has a relatively high flatness and smoothness, and at the same time, the N surface of the epitaxial wafer 200 can be vapor-deposited form a cathode. Specifically, the cathode can be patterned copper foil, or a gold wire.

It should be understood that the thinning and polishing treatment can also be performed in step S12, that is, the epitaxial wafer 200 can be thinned and polished before the epitaxial wafer 200 is split.

Preferably, whether it is a metal substrate or a double-layer thermally conductive substrate, the heat sink substrate 300 provided by the present disclosure and the epitaxial wafer 200 have a good expansion coefficient matching degree, so as to ensure that the heat generated by the semiconductor laser resists the heat in the subsequent work. Both the sink substrate 300 and the epitaxial wafer 200 have the same or similar heating deformation, which reduces the stress caused by heating, so as to ensure that the entire laser will not be strained and improve the life of the laser.

Further, the bonding method of the epitaxial wafer 200 and the heat sink substrate 300 is welding or adhering. Specifically, when the heat sink substrate 300 is a metal substrate, the epitaxial wafer is preferably bonded to the heat sink substrate by welding. In this case, the heat sink substrate not only has the effect of dissipating heat, but also acts as a conductive layer; when the heat sink substrate 300 is a non-conductive substrate such as ceramic or sapphire, the epitaxial wafer 200 is preferably attached to the heat sink substrate by adhering. In this case, the heat sink substrate is only used for heat dissipation.

In S14, the epitaxial wafer 200 is divided along the gaps to obtain a plurality of laser chips.

Figure 5:
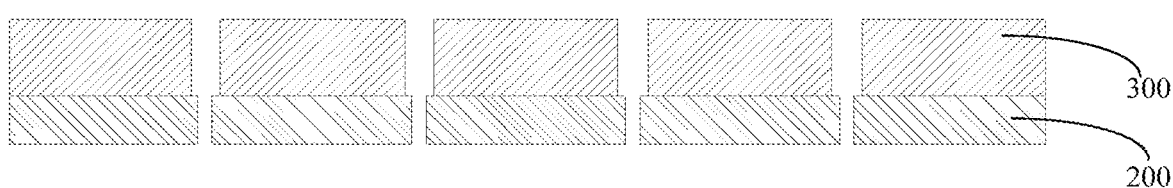
FIG. 5 is a schematic side view of the splitting of the epitaxial wafer in the present disclosure in step S141.
Figure 6:
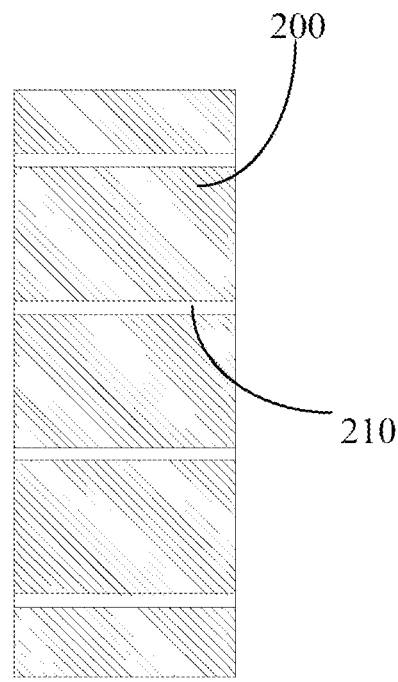
FIG. 6 is a schematic top view of a splitting of the epitaxial wafer in the present disclosure in step S141.
Figure 7:
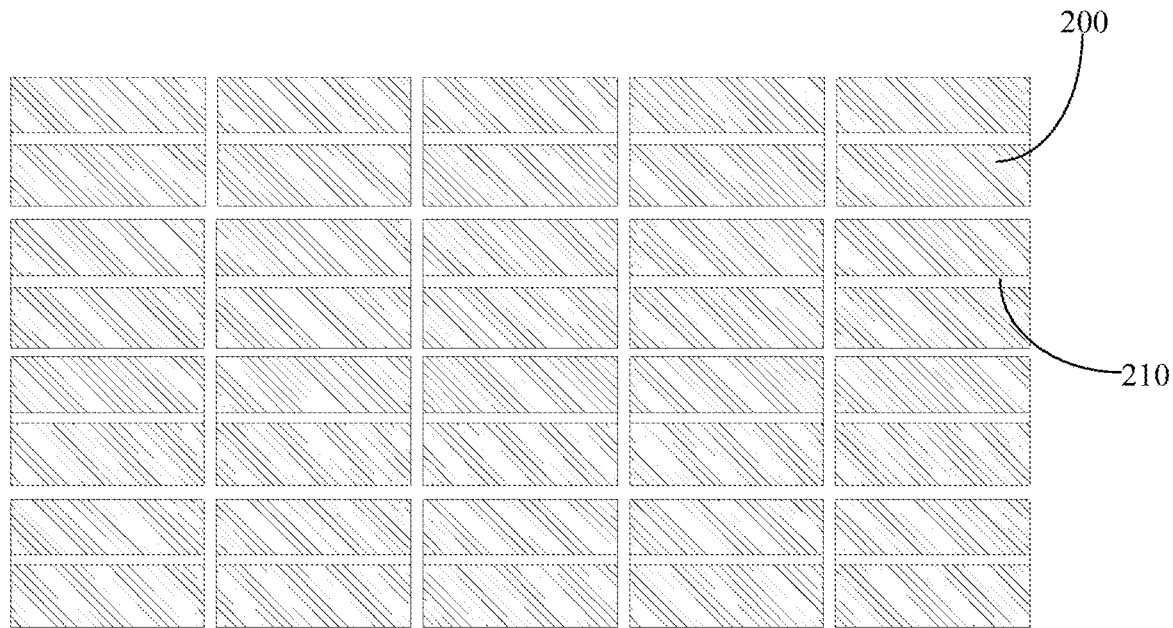
FIG. 7 is a schematic top view of a further splitting of the epitaxial wafer in the present disclosure in step S142.

As shown in FIG. 5 through FIG. 7, in a specific embodiment, the epitaxial wafer 200 needs to be divided according to specific requirements to obtain laser chips of the required models and sizes. Dividing the epitaxial wafer 200 along the gaps includes dividing the epitaxial wafer 200 along the gaps perpendicular to the direction of the resonant cavities 210 and parallel to the direction of the resonant cavities 210, so as to obtain a plurality of laser chips each including one heat sink substrate 300.

It can be understood that during specific division, it can be divided according to actual specifications, so as to obtain laser chips of required types, so that the obtained laser chips include the required number of laser bars, and the like. Specifically, some laser chips include one laser bar, and some semiconductor lasers include a plurality of laser bars.

Figure 3:
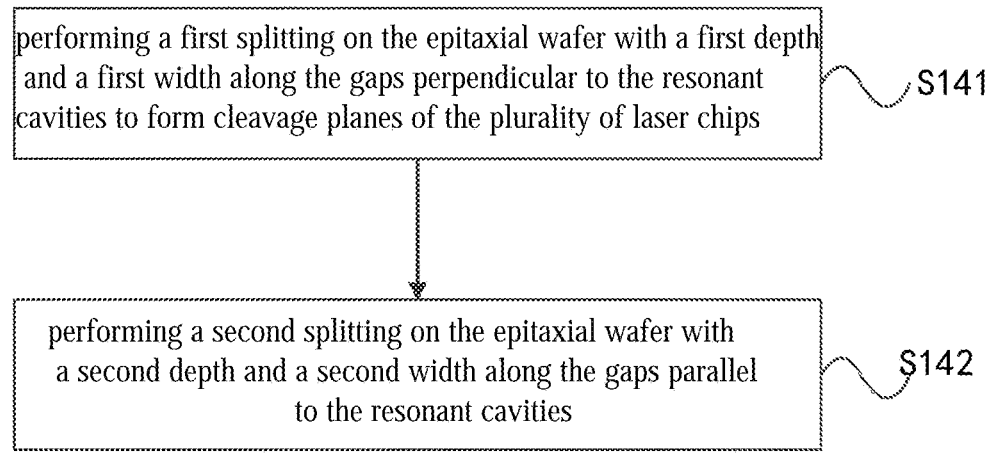
FIG. 3 is a schematic flowchart of the sub-step of S14 of the fabrication method for the semiconductor laser according to the present disclosure.

Please refer to FIG. 3. FIG. 3 is a sub-step of S14 of the fabrication method for the semiconductor laser according to the present disclosure, which specifically includes:

In S141, a first splitting on the epitaxial wafer 200 with a first depth and a first width along the gaps perpendicular to the resonant cavities 210 is performed to obtain a plurality of laser chips.

Since the heat sink substrates 300 are fixed on the epitaxial wafer 200 in an array, the gaps include a plurality of gaps perpendicular to the resonant cavities 210 and a plurality of gaps parallel to the resonant cavities 210. The plurality of gaps perpendicular to the resonant cavities 210 and the plurality of gaps parallel to the resonant cavities 210 are vertically and orthogonally arranged.

The first splitting of the epitaxial wafer 200 with the first depth and the first width is performed along the gaps perpendicular to the resonant cavities 210 to obtain the plurality of laser chips as shown in FIG. 5 and FIG. 6.

Further, after the first splitting of the epitaxial wafer 200, the laser chips with the cleavage planes can be directly entered into step S15 for coating operation. Or according to the specific size requirements, the coating operation of S15 can be performed after further cutting. The specific cutting method is shown in S142.

In S142, a second splitting on the epitaxial wafer 200 with the second depth and second width is performed along the gaps parallel to the resonant cavities 210.

The second splitting on the epitaxial wafer 200 with the second depth and second width is split along the gaps parallel to the resonant cavities 210, which can split from the P surface to the N surface of the epitaxial wafer 200 or split from the N surface to the P surface, to obtain the plurality of laser chips as shown in FIG. 7.

Furthermore, a diamond knife can be used to assist in the splitting, and the crystal lattice along the epitaxial wafer 200 can be separated relatively easily, and a flat and smooth cleavage plane can be produced. Dry etching or wet etching can also be used to assist cleaving, and combined with other treatments can be used to produce a flat and smooth cleavage plane. Wherein, the second cleavage described above is similar to the first cleavage, and its second depth is equal to the first depth, and both are greater than or equal to the thickness of the epitaxial wafer 200, specifically the actual thickness of the epitaxial wafer 200. The second width is equal to the first width, and both are less than the width of the gaps. And when splitting, the split center coincides with the center line of one of the gaps.

For the laser chip, the above-mentioned splitting sequence is not limited, and the first splitting may be performed first and then the second splitting may be selectively performed. In the specific splitting process, the second splitting can be performed according to the required specifications, so as to obtain the laser chips of the required specifications.

Since the second width and the first width are both less than the width of the gaps, the length of the epitaxial wafer 200 in the direction parallel to the resonant cavities 210 of the formed laser chip is greater than the length of the heat sink substrate 300. The advantage of the structure is to reduce the shadow effect during the subsequent coating of the resonant cavity surfaces of the resonant cavities 210, which is beneficial to improve the uniformity of the coating on the front and back cavity surfaces of the resonant cavities.

In S15, the plurality of laser chips is stacked, and the plurality of laser chips in a stacked state is coated to form a plurality of semiconductor lasers.

Figure 8:
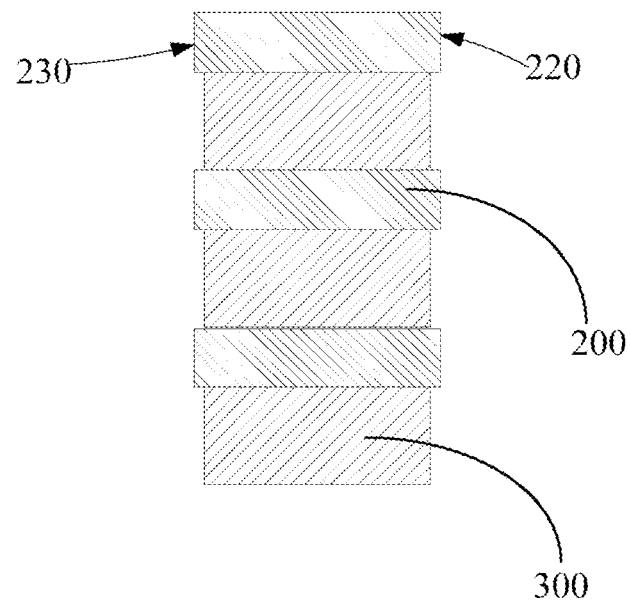
FIG. 8 is a front view of stacking and coating a plurality of laser chips in the present disclosure.

As shown in FIG. 8, after the plurality of laser chips including the resonant cavities 210 is obtained, the plurality of laser chips is stacked. Since the sizes of the cleaved laser chips may be different, the plurality of lasers are sequentially stacked according to the direction of the resonant cavities 210, so that the directions of the resonant cavities 210 of the plurality of laser chips are the same, and front cavity surfaces 220 of the plurality of laser chips perpendicular to the resonant cavities 210 and back cavity surfaces 230 of the plurality of laser chips perpendicular to the resonant cavities 210 are respectively on the same plane.

Specifically, coating the cleavage planes (splitting planes) in the direction of the resonant cavities 210 of the laser chips, including coating the front cavity surfaces 220 (light emitting surfaces) with an antireflection film, and coating the back cavity surfaces 230 (rear surface) with a reflective film and so on to form the resonant cavities that proliferate stimulated radiation photons.

The spraying of the front cavity surfaces 220 and the back cavity surfaces 230 can be performed simultaneously or separately. After the coating is completed, the plurality of semiconductor lasers is formed. Due to the completion of electrode production, coating, etc., each of the semiconductor lasers include at least one laser bar, and the heat sink substrate 300 is used as the anode of the laser chip to complete the electrical connection.

It should be understood that during the specific splitting, splitting can be performed according to actual specifications requirements to obtain semiconductor lasers of the required models, so that the obtained semiconductor lasers include the required number of laser bars, etc. Specifically, some semiconductor lasers 30 include one laser bar, and some semiconductor lasers include a plurality of laser bars. Compared with the existing multi-laser bar semiconductor laser chips formed by one-bar-one-bar welding, the preparation of the multi-laser bar semiconductor laser chips can be completed through the improvement of the cutting process of the epitaxial wafer, which saves the welding process and further improves the production efficiency.

Moreover, the above relates to the splitting depth of the epitaxial wafer 200, that is, the second depth and the first depth are determined according to specific operations. For example, after the epitaxial wafer 200 is thinned in advance, the depth is the current thickness of the epitaxial wafer 200, that is, the thickness after thinning.

Figure 9:
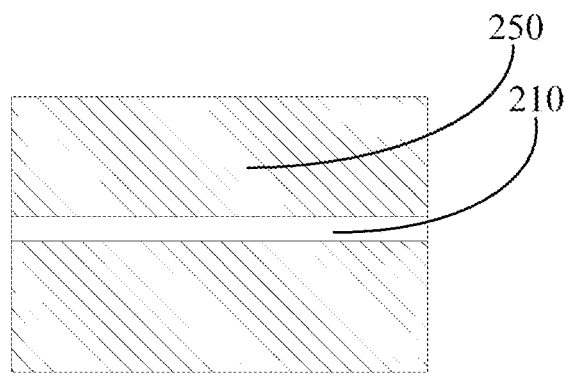
FIG. 9 is a schematic top view of a semiconductor laser prepared in the present disclosure.
Figure 10:
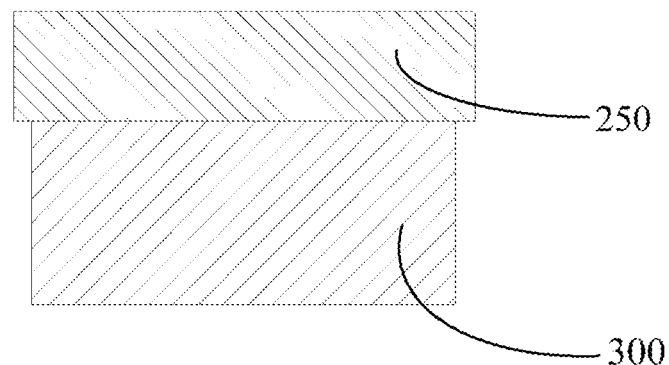
FIG. 10 is a schematic front view of the semiconductor laser prepared in the present disclosure.

Please refer to FIG. 9 and FIG. 10. A structural schematic diagram of the semiconductor laser is provided by the present disclosure, that is, the structural schematic diagram of the semiconductor laser prepared by the above process. FIG. 9 is a schematic top view of the semiconductor laser provided in the present disclosure. FIG. 10 is a schematic front view. The semiconductor laser includes the heat sink substrate 300 and the laser bar 250 disposed on the heat sink substrate 300, wherein the laser bar 250 includes the resonant cavity 210.

As shown in FIG. 10, the length and width of the heat sink substrate 300 are less than the length of the laser bar 250, so that the resonant cavity 210 protrudes slightly from the heat sink substrate 300. The advantage of this design is that the subsequent stacked bars coating process, the shadow effect of the coating caused by the shielding of the heat sink substrate can be reduced, which is beneficial to improve the coating uniformity of the front and back cavity surfaces of the resonant cavity, thereby improving the stability and service life of the laser.

In summary, the present disclosure provides a semiconductor laser and a fabrication method thereof, by splitting an epitaxial wafer after bonding a heat sink substrate array thereon to form a plurality of laser chips, then stacking, and then coating, the support bars in the prior art are replaced directly with the heat sink substrates, thereby saving materials, and reducing the process of welding with the heat sink substrate after coating the support bars and separating again; fabrication is completed directly in one step, thereby simplifying the process and reducing costs.

The above are only embodiments of the present disclosure, and do not limit the scope of the present disclosure. Any equivalent results or equivalent process transformations made using the contents of the description and drawings of the present disclosure, or directly or indirectly applied to other related technical fields, shall fall within the scope of protection of the present disclosure.

What is claimed is:

1. A fabrication method for a semiconductor laser, comprising the following steps:

S11: providing a heat sink motherboard, and cutting the heat sink motherboard to form a plurality of heat sink substrates;

S12: providing an epitaxial wafer, the epitaxial wafer comprising a plurality of resonant cavities arranged in parallel and formed by etching;

S13: bonding the plurality of heat sink substrates to the epitaxial wafer in an array to form a plurality of first gaps parallel to a direction of the plurality of resonant cavities and a plurality of second gaps perpendicular to the direction of the plurality of resonant cavities, and wherein each of the plurality of first gaps is between any two adjacent of the plurality of resonant cavities;

S14: dividing the epitaxial wafer along the plurality of second gaps or along the plurality of second gaps and the plurality of first gaps to obtain a plurality of laser chips, wherein each of the plurality of laser chips comprises at least one laser bar, each of the laser bar has one of the plurality of resonant cavities and is on a corresponding one of the plurality of heat sink substrates; and S15: stacking the plurality of laser chips and coating the plurality of laser chips in a stacked state to form a plurality of semiconductor lasers, so that each of the plurality of semiconductor lasers comprises one of the plurality of laser chips and a corresponding one or more of the plurality of heat sink substrates.

2. The fabrication method of claim 1, wherein the step S14 comprises:

performing a first splitting on the epitaxial wafer with a first depth and a first width along the plurality of second gaps perpendicular to the resonant cavities to form cleavage planes of the plurality of laser chips.

3. The fabrication method of claim 2, wherein the step S15 comprises:

sequentially stacking the plurality of the laser chips, so that front cavity surfaces of the plurality of laser chips perpendicular to the resonant cavities and back cavity surfaces of the plurality of laser chips perpendicular to the resonant cavities are respectively on the same plane.

4. The fabrication method of claim 2, wherein the step S14 further comprises:

performing a second splitting on the epitaxial wafer with a second depth and a second width along the plurality of first gaps parallel to the resonant cavities.

5. The fabrication method of claim 3, wherein the step S15 comprises:

coating the cleavage planes of the plurality of laser chips in the stacked state to form resonant cavities, wherein an antireflection film is coated on front cavity surfaces of the resonant cavities, and a reflective film is coated on back cavity surfaces of the resonant cavities.

6. The fabrication method of claim 4, wherein the second depth is equal to the first depth, and both are greater than or equal to a thickness of the epitaxial wafer; the second width is equal to the first width, and both are less than a width of each of the plurality of first gaps and a width of each of the plurality of second gaps.

7. The fabrication method of claim 1, wherein the step S12 or S13 further comprises thinning and polishing a side of the epitaxial wafer away from the heat sink substrates.

8. The fabrication method of claim 1, wherein the heat sink substrates are one of metal substrates, ceramic substrates, or sapphire substrates.

* * * * *